(12) United States Patent
Lin et al.

(10) Patent No.: US 8,362,529 B2
(45) Date of Patent: Jan. 29, 2013

(54) POWER SEMICONDUCTOR DEVICE HAVING ADJUSTABLE OUTPUT CAPACITANCE

(75) Inventors: Wei-Chieh Lin, Hsinchu (TW); Guo-Liang Yang, Hsinchu (TW); Shian-Hau Liao, Taichung (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 399 days.

(21) Appl. No.: 12/784,505

(22) Filed: May 21, 2010

(65) Prior Publication Data
US 2011/0215374 A1 Sep. 8, 2011

(30) Foreign Application Priority Data
Mar. 5, 2010 (TW) ................................ 99106460 A

(51) Int. Cl.
*H01L 29/76* (2006.01)
(52) U.S. Cl. ................................ 257/288; 257/E29.265
(58) Field of Classification Search .................. 257/288, 257/298, 329, 330, 341, 139, 296, E27.016, 257/E29.2
See application file for complete search history.

(56) References Cited

U.S. PATENT DOCUMENTS
5,623,152 A * 4/1997 Majumdar et al. ............ 257/330
8,258,555 B2 * 9/2012 Lin ................................. 257/288

* cited by examiner

*Primary Examiner* — Thomas L Dickey
(74) *Attorney, Agent, or Firm* — Winston Hsu; Scott Margo

(57) ABSTRACT

A power semiconductor device having adjustable output capacitance includes a semiconductor substrate having a first device region and a second device region defined thereon, at lest one power transistor device disposed in the first device region, a heavily doped region disposed in the semiconductor substrate of the second device region, a capacitor dielectric layer disposed on the heavily doped region, a source metal layer disposed on a top surface of the semiconductor substrate and electrically connected to the power transistor device, and a drain metal layer disposed on a bottom surface of the semiconductor substrate. The source metal layer in the second device, the capacitor dielectric layer and the heavily doped region form a snubber capacitor.

12 Claims, 16 Drawing Sheets

POWER SEMICONDUCTOR DEVICE HAVING ADJUSTABLE OUTPUT CAPACITANCE

BACKGROUND OF THE INVENTION

1. Field of the Invention

The present invention relates to a power semiconductor device and a manufacturing method thereof, and more particularly to a power semiconductor device having adjustable output capacitance and a manufacturing method thereof.

2. Description of the Prior Art

Power semiconductor devices are typical semiconductor devices in power management applications, such as a switching power supply, a power control IC of a computer system or peripherals, a power supply of a backlight, motor controller, etc. Power semiconductor devices can include various kinds of transistors, such as an insulated gate bipolar transistor (IGBT) and a metal-oxide-semiconductor field effect transistor (MOSFET).

Please refer to FIG. 1, which is a schematic diagram illustrating a cross-sectional view of a trench MOSFET device according to the prior art. As shown in FIG. 1, the conventional trench MOSFET device 10 of the prior art includes a drain metal layer 12, an N-type substrate disposed on the drain metal layer 12, an N-type epitaxial layer 16 disposed on the N-type substrate 14, two P-type doped base regions 18 disposed in the N-type epitaxial layer 16, two N-type doped source regions disposed in the P-type doped base regions 18, an inter-layer dielectric (ILD) layer 22 and a source metal layer 24. The N-type epitaxial layer 16 has a trench 26, and an insulating layer 28 and a gate conductive layer 30 are sequentially disposed in the trench. The gate conductive layer 30 serves as a gate of the trench MOSFET device 10. In addition, each N-type doped source region 20 and each P-type doped base region are disposed at a side of the trench 26. The N-type doped source region 20 is regarded as a source of the trench MOSFET device 10, and each P-type doped base region 18 adjacent to the insulating layer 28 serves as a channel of the trench MOSFET device 10. The N-type epitaxial layer 16 serves as a drain of the trench MOSFET device 10. The ILD layer 22 is disposed on the gate conductive layer 30 and a part of the N-type doped source region 20, and the source metal layer 24 covers the ILD layer 22, each N-type doped source region 20 and each P-type doped base region 18, so that the source metal layer 24 is electrically connected to the each N-type doped source region 20 and each doped base region 18. The gate conductive layer 30, the ILD layer 22 and the source metal layer 24 form a first gate-source capacitor Cgs1, and the gate conductive layer 30, the insulating layer 28 and each P-type doped base region 18 form a second gate-source capacitor Cgs2. In addition, the gate conductive layer 30, the insulating layer 28 and the N-type epitaxial layer 16 form a gate-drain capacitor Cgd, and a depletion region between the P-type doped base region 18 and the N-type epitaxial layer 16 forms a drain-source capacitor Cds.

The desire for ever more compact electronic devices has pushed for size reductions in integrated circuits. Therefore, higher integrations and higher densities are developed continuously. The layout design for the conventional trench MOSFET device 10 has been investigated to reduce the trench width and the trench pitch. However, when the width of the trench 26 is reduced, the coupled area between the gate conductive layer 30 and the N-type epitaxial layer 16 is also reduced, and the contact area of the P-type doped base region 18 and the N-type epitaxial layer 16 is also reduced. Thus a capacitance of the gate-drain capacitor Cgd and a capacitance of the drain-source capacitor Cds are reduced, and an output capacitance of the trench MOSFET device 10 formed by the capacitance of the gate-drain capacitor Cgd and the capacitance of the drain-source capacitor Cds is reduced accordingly. In addition, the capacitance of the drain-source capacitor Cds is far larger than the capacitance of the gate-drain capacitor Cgd.

Generally speaking, the conventional trench MOSFET device is usually used in the converter, such as synchronous buck converter, of power management circuit, and is used to be a switching element of the converter, so that the conventional trench MOSFET device usually needs to perform an action of turning on or turning off. When the conventional trench MOSFET device is turned off, the output capacitance of the conventional trench MOSFET device is charged to a same voltage as an outside transformer. However, the converter further includes an inductor device, and the output capacitor and the inductor device form an LC oscillating circuit. Voltage spikes are generated accordingly, and the output capacitance of the conventional trench MOSFET device is reduced with decrease of the total device size and the trench width. Therefore, the voltage spikes caused by turning off the conventional trench MOSFET device are increased, and higher power loss is generated.

Please refer to FIG. 2, which is a schematic diagram illustrating a conventional circuit for reducing the voltage spikes. As shown in FIG. 2, a conventional method for reducing the voltage spikes is to electrically connect a snubber circuit 12 in parallel between the source S and the drain D of the conventional trench MOSFET device 10, and the snubber circuit 12 is formed by connecting a capacitor C and a resistor R in series. The capacitor C outside the conventional trench MOSFET device can be used to increase the output capacitance of the conventional trench MOSFET device 10 and reduce the voltage spikes. However, the extra electronic device generates extra circuit cost, and increases extra manufacturing process of welding. Thus the manufacturing cost is increased.

Accordingly, it is still needed for a novel manufacturing method of power semiconductor device to conveniently and economically resolve or mitigate the problem of the voltage spikes as aforesaid.

SUMMARY OF THE INVENTION

It is therefore a primary objective of the present invention to provide a power semiconductor device having an adjustable output capacitance and manufacturing method thereof to overcome the problem of the aforementioned voltage spikes.

According to the present invention, a power semiconductor device having an adjustable output capacitance is disclosed. The power semiconductor device comprises a semiconductor substrate, at least one power transistor device, a heavily doped region, a capacitor dielectric layer, a source metal layer, and a drain metal layer. The semiconductor substrate has a top surface and a bottom surface, and the top surface of the semiconductor substrate has a first device region and a second device region defined thereon. The power transistor device is disposed in the semiconductor substrate of first device region. The heavily doped region has a first conductive type, and is disposed in the semiconductor substrate of the second device region. The capacitor dielectric layer is disposed on the heavily doped region, and the capacitor dielectric layer is in contact with the heavily doped region. The source metal layer is disposed on the top surface of the semiconductor substrate, and the source metal layer is electrically connected to the power transistor device. The source metal layer, the capacitor dielectric layer and the heavily doped region disposed in the second device region form a snubber capacitor. The drain metal layer is disposed on the bottom surface of the semiconductor substrate.

According to the present invention, a manufacturing method of a power semiconductor device having an adjustable output capacitance is disclosed. First, a semiconductor substrate is provided. The semiconductor substrate has a top surface and a bottom surface, and the top surface of the semiconductor substrate has a first device region and a second device region defined thereon. Then, the semiconductor substrate in the second device region is covered with a field oxide layer, and the semiconductor substrate in the first device region is exposed. Thereafter, at least one first doped base region, a second doped base region, at least one trench, an insulating layer, a gate conductive layer and at least one doped source region are formed in the exposed semiconductor substrate. The doped source region has a first conductive type, and the first doped base region and the second doped base region have a second conductive type. Next, an ILD layer is formed on the semiconductor substrate and the field oxide layer. Then, a photolithographic process and an etching process are performed to remove the field oxide layer and the ILD layer in the second device region and to expose the semiconductor substrate in the second device region. Next, an ion implantation process and a drive-in process are performed to form a heavily doped region having the second conductive type in the exposed semiconductor substrate. Then, a capacitor dielectric layer is formed on the top surface of the semiconductor substrate in the second device region. After, a source metal layer is formed on the top surface of the semiconductor substrate, and a drain metal layer is formed on the bottom surface of the semiconductor substrate.

In the present invention, the manufacturing method of the power semiconductor device simultaneously fabricates the snubber capacitor in the step of fabricating the power transistor device, so that the power transistor device and the snubber capacitor are manufactured within a same power semiconductor device. The snubber capacitor and the power transistor device in the power semiconductor device use a same drain metal layer and a same source metal layer, and the snubber capacitor is electrically connected between the drain and the source of the power transistor device. Accordingly, the output capacitance of the power semiconductor device can be raised, and the problem of the voltage spikes is solved when the power semiconductor device is turned off. Further, the power semiconductor device in the present invention does not require electrically connecting to any extra snubber circuit, and the cost of the power semiconductor device in the present invention can be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
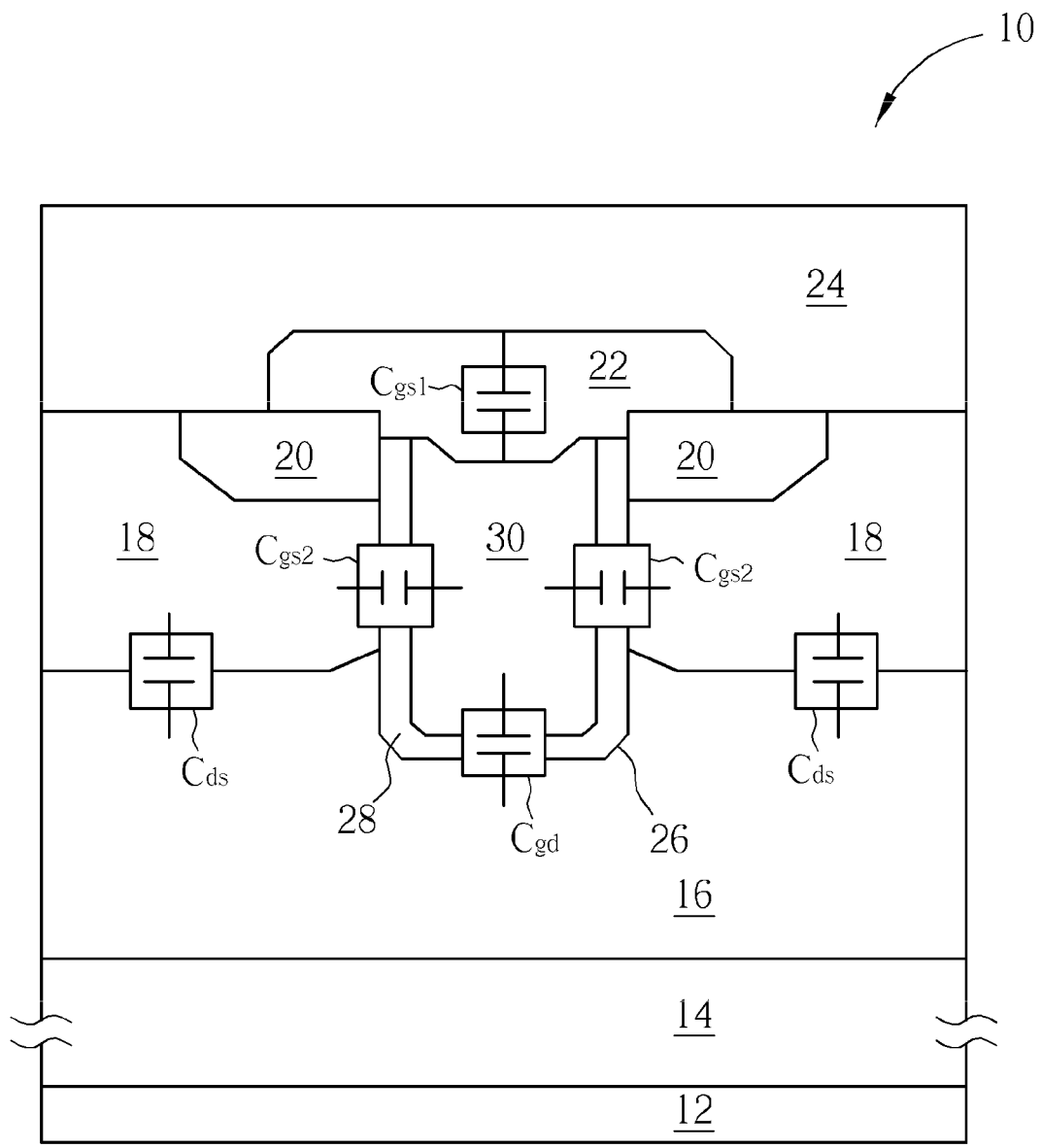
FIG. 1 is a schematic diagram illustrating a cross-sectional view of a trench MOSFET device according to the prior art.
Figure 2:
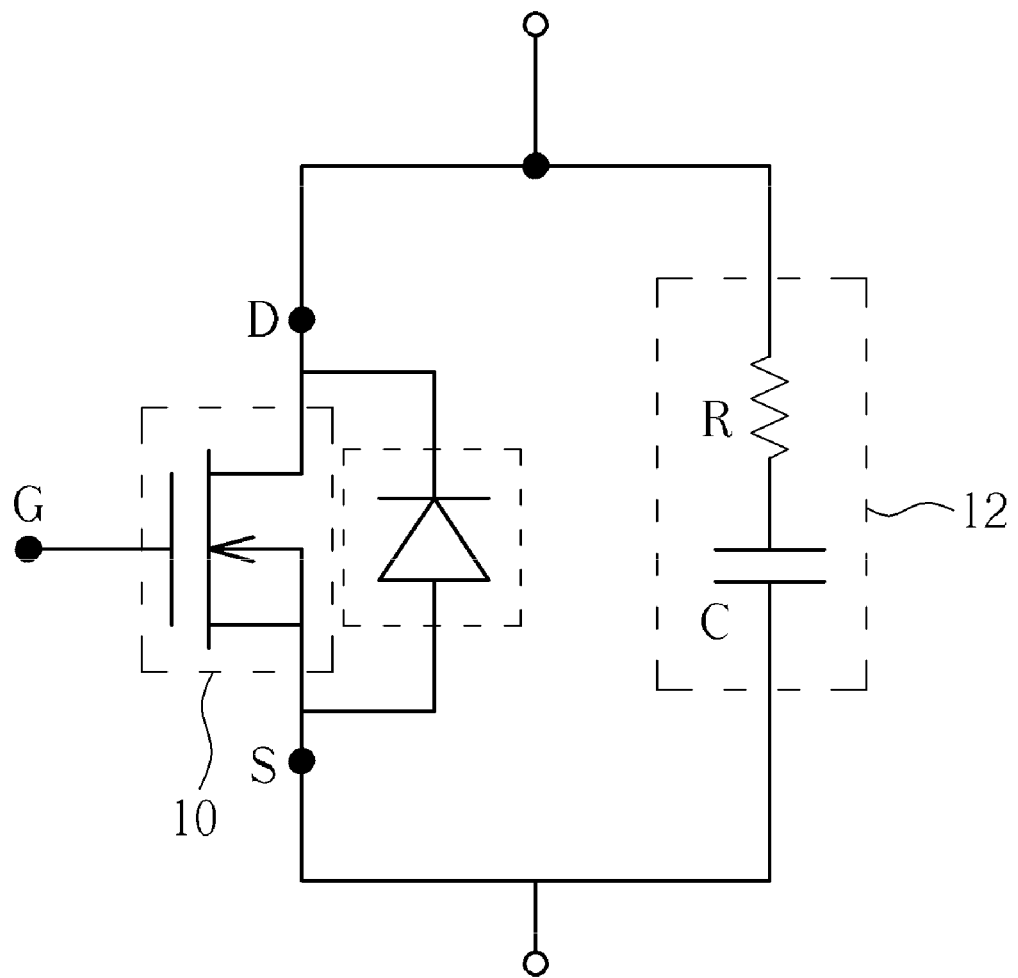
FIG. 2 is a schematic diagram illustrating a conventional circuit for reducing the voltage spikes.
Figure 3:
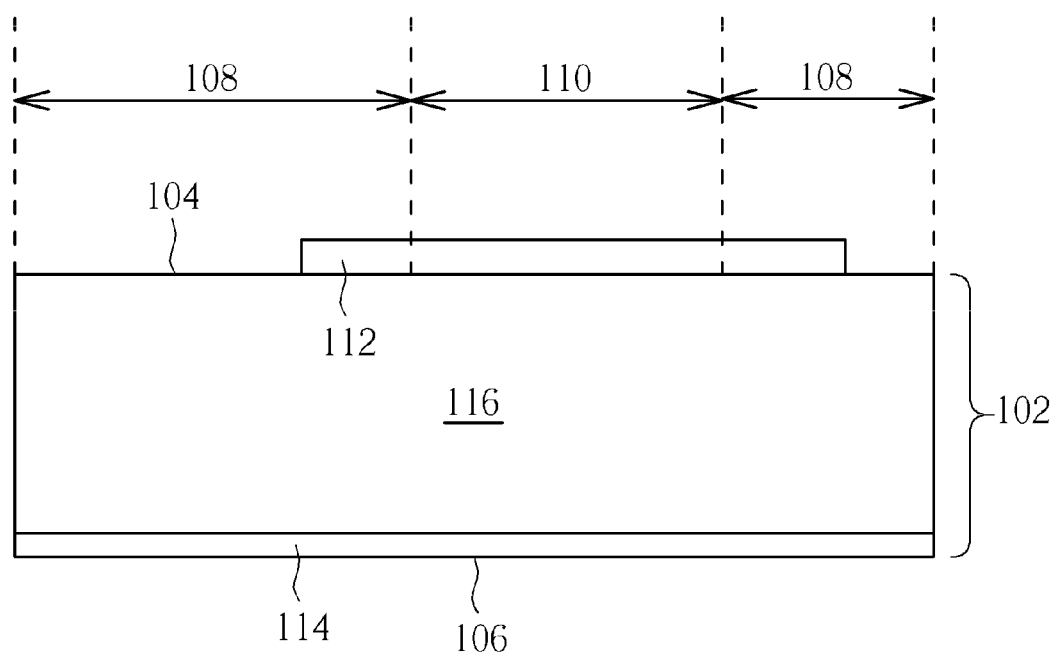
FIG. 3 through FIG. 10 are schematic diagrams illustrating a manufacturing method of a power semiconductor device having an adjustable output capacitance according to a first embodiment of the present invention.

Please refer to FIG. 3 through FIG. 10, which are schematic diagrams illustrating a manufacturing method of a power semiconductor device having an adjustable output capacitance according to a first embodiment of the present invention. First, as shown in FIG. 3, a semiconductor substrate 102 is provided. The semiconductor substrate 102 has a top surface 104 and a bottom surface 106, and the top surface 104 of the semiconductor substrate 102 has a first device region 108 and a second device region 110 defined thereon. The first device region 108 is defined to manufacture a power semiconductor device, and the second device region 110 is defined to manufacture a snubber capacitor. Then, the semiconductor substrate 102 in the second device region 110 is covered with a field oxide layer 112, and the semiconductor substrate 102 in the first device region 108 is exposed. Thus the semiconductor substrate 102 in the second device region 110 can be prevented from being affected by the following manufacturing process of the power transistor device. In the present embodiment, the semiconductor substrate 102 has a first conductive type, and the first conductive type takes N type as an example. But the present invention is not limited herein. The N-type semiconductor substrate 102 of the present embodiment includes an N-type substrate 114, such as silicon substrate, and an N-type epitaxial layer 116 disposed on the N-type substrate 114. An implantation concentration of the N-type substrate 114 is higher than an implantation concentration of the N-type epitaxial layer 116. Ability of voltage endurance is increased with increase of a thickness and decrease of the implantation concentration of the N-type epitaxial layer 116, so that the thickness of the N-type epitaxial layer 116 can be adjusted according to the required voltage endurance.

Figure 4:
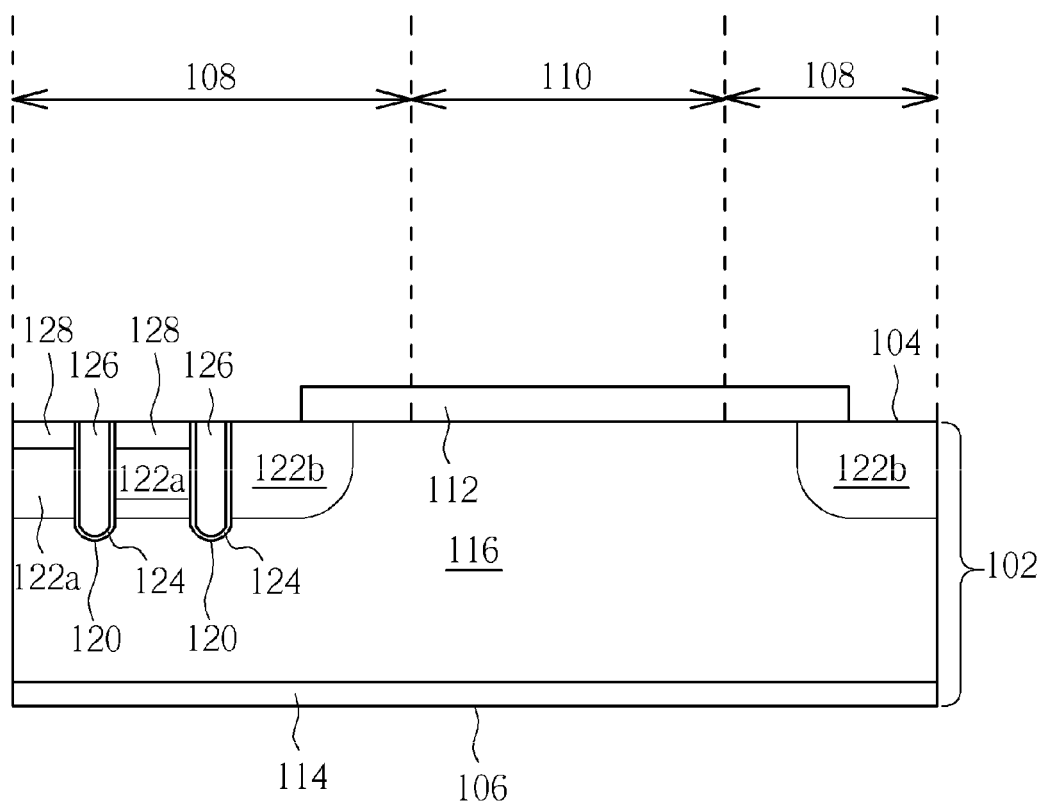

Next, as shown in FIG. 4, at least one first doped base region 122a, a second doped base region 122b, at least one trench 120, an insulating layer 124, a gate conductive layer 126 and at least one doped source region 128 are formed in the N-type semiconductor substrate 102 of the first device region 108. The first doped base region 122a and the second doped base region 122b have a second conductive type, and the doped source region 128 has the first conductive type. The second conductive type of the present embodiment takes P type as an example, but is not limited herein. For example, the step of forming the first P-type doped base region 122a, the second P-type doped base region 122b, the trench 120, the insulating layer 124, the gate conductive layer 126 and the N-type doped source region 128 is detailed in the following description. An ion implantation process and a drive-in process are first performed to form a P-type doped base region in the N-type epitaxial layer 116 uncovered with the field oxide layer 112. Then, a photolithographic and etching process is performed to form a trench 120 on the top surface 104 of the N-type semiconductor substrate 102 in the first device region 108, so that the trench 120 exposes the N-type semiconductor substrate 102 and divides the P-type doped base region into the first P-type doped base region 122a and the second P-type doped base region 122b. Next, the insulating layer 124, such as dielectric layer formed by borophosposilicate glass (BPSG) or other materials, and the gate conductive layer 126, such as doped polysilicon material, are sequentially formed in the trench 120, and the insulating layer 124 electrically insulates the gate conductive layer 126 from the first P-type doped base region 122a, the second P-type doped base region 122b and the N-type semiconductor substrate 102. Then, an ion implantation process and a drive-in process are performed to form the N-type doped source region 128. The number of the trench 120 represents the number of the gate of the power transistor device. The number of the power transistor device can be plurality, so that the numbers of the trench 120, the first P-type doped base region 122a and the N-type doped source region 128 of the present invention can be plurality.

Figure 5:
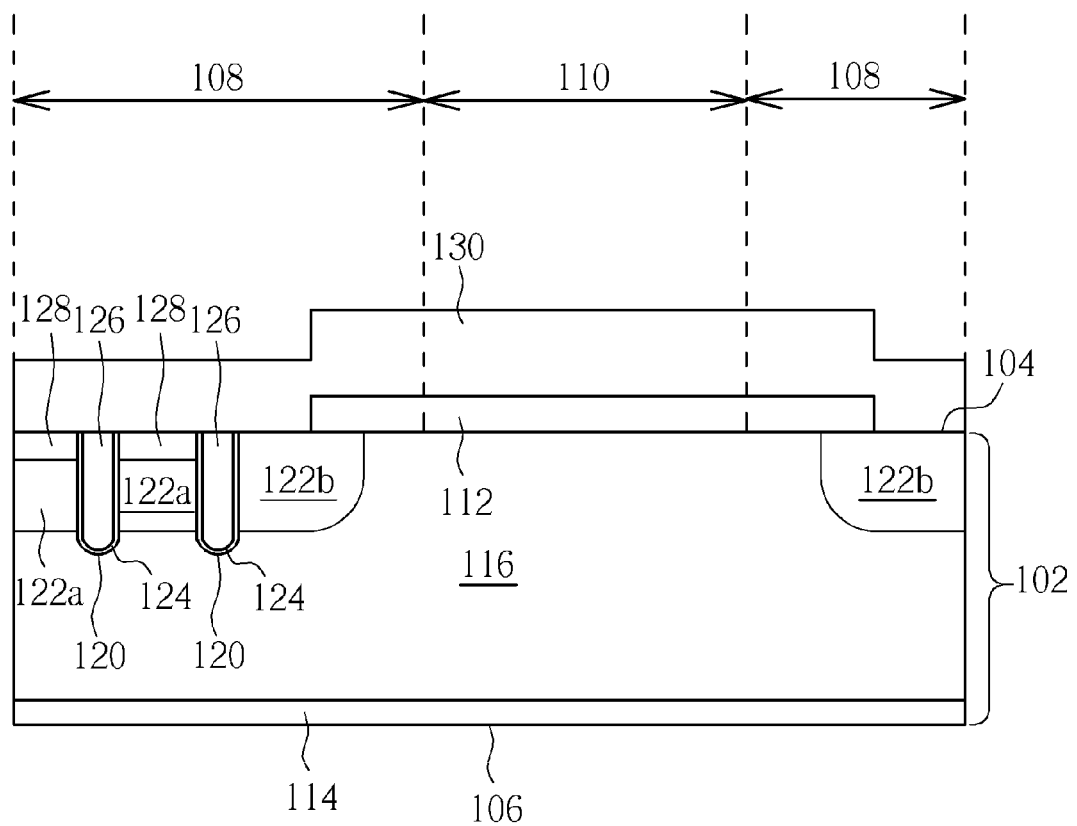

Then, as shown in FIG. 5, the N-type semiconductor substrate 116 in the first device 108 and the field oxide layer 112 in the second device region 110 are completely covered with an ILD layer 130, such as a dielectric layer formed by BPSG or other materials.

Figure 6:
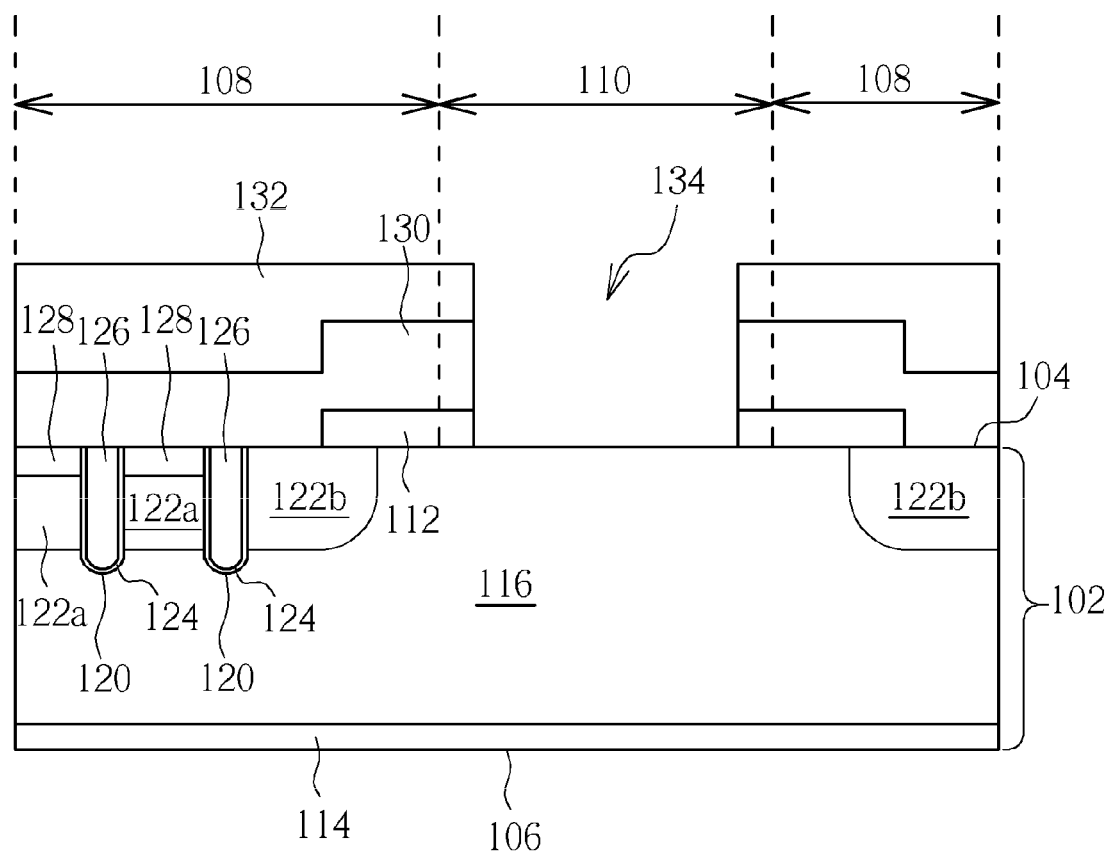
Figure 7:
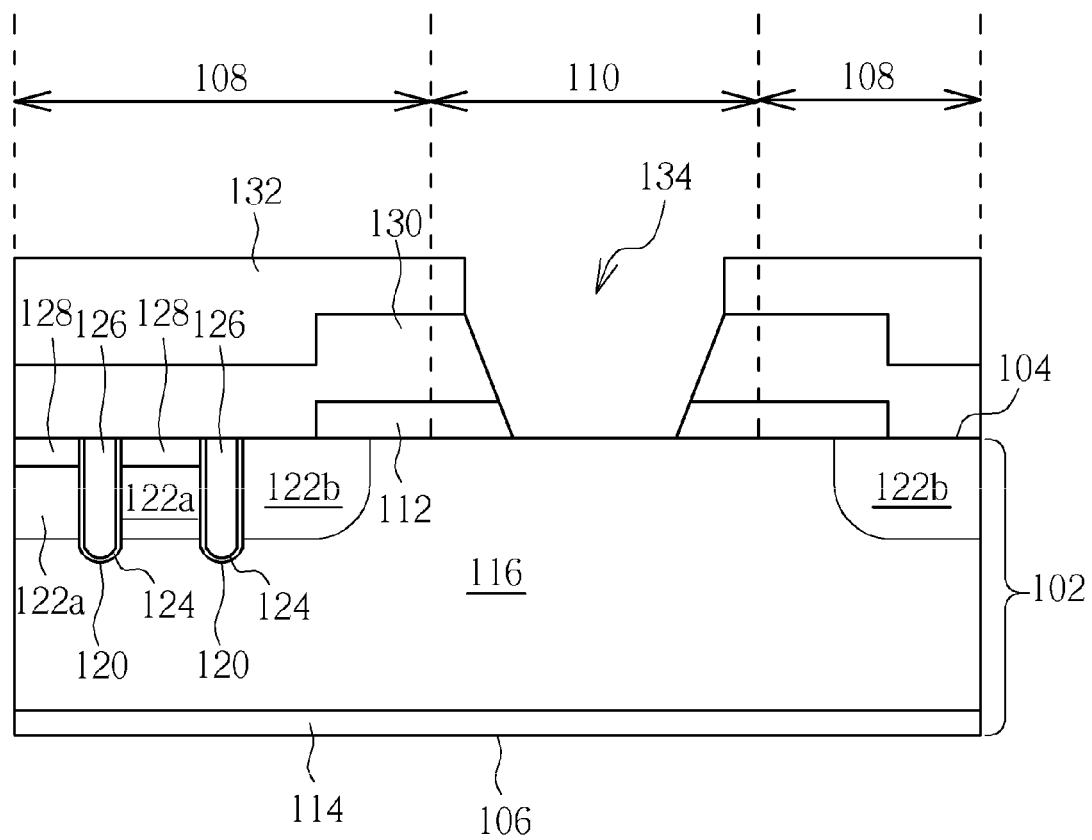

Next, as shown in FIG. 6, a photolithographic process is performed to form a patterned photoresist layer 132 on the ILD layer 130. The patterned photoresist layer 132 has an opening 134, and the opening 134 is disposed in the second device region 110 and exposes the ILD layer 130 in the second device region 110. Thereafter, the patterned photoresist layer 132 serves as a mask, and an etching process is performed to expose the N-type semiconductor substrate 102 in the second device region 110. In the present embodiment, the etching process is a dry etching process, so that sidewalls of the ILD layer 130 and the field oxide layer 112 being etched are vertical sidewalls. The present invention is not limited herein, and the etching process can be a wet etching process, so that sidewalls of the ILD layer 130 and the field oxide layer 112 being etched are inclined sidewalls, as shown in FIG. 7. The field oxide layer 112 without being removed is disposed at a border between the first device region 110 and the second device region 112, and a width of the field oxide layer 112 without being removed is substantially in a range from 2 micrometers to several tenth micrometers.

Figure 8:
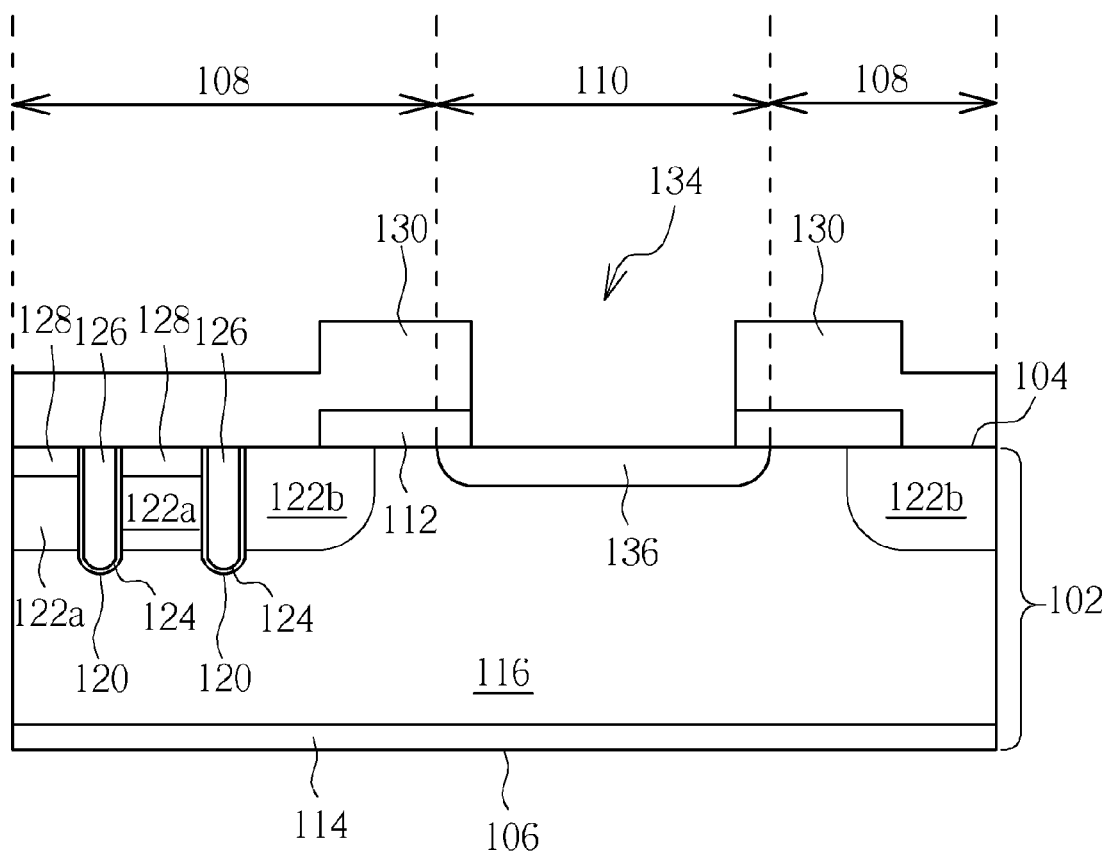

Next, as shown in FIG. 8, the patterned photoresist layer 132 is continued to serve as a mask, and an ion implantation process is performed to implant N-type dopant ion into the exposed N-type semiconductor substrate 102. Subsequently, the patterned photoresist layer 132 is removed, and then, a drive-in process is performed to form an N-type heavily doped region 136 in the N-type semiconductor substrate 102 of the second device region 110. An area of the N-type heavily doped region 136 is defined as an area of the second device region 110. In addition, an implantation concentration of the N-type heavily doped region 136 is higher than an implantation concentration of the N-type epitaxial layer 116, and the implantation concentration of the N-type heavily doped region 136 is in a range from $10^{12}$ cm$^{-3}$ to $10^{16}$ cm$^{-3}$. Due to the disposition of the N-type heavily doped region 136 which implantation concentration is higher than that of the N-type epitaxial layer 116, a depletion region formed by the N-type epitaxial layer 116 and the second P-type doped base region 122b in the first device region 108 can be prevented from extending into the second device region 110 and affecting the operation of the snubber capacitor. The present invention is not limited to use the patterned photoresist layer 132 as a mask. The patterned photoresist layer 132 also can be removed, and then, the ILD layer 130 serves as a mask to perform the ion implantation process.

Figure 9:
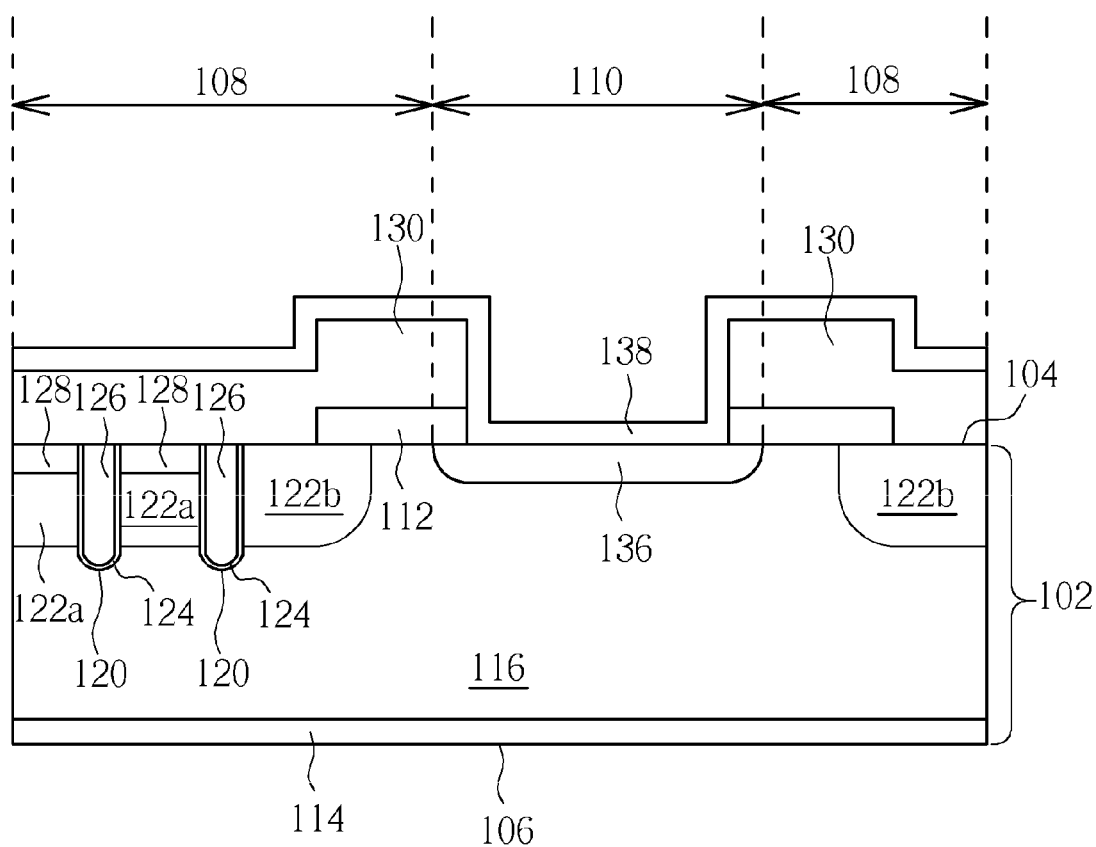

Then, as shown in FIG. 9, a chemical vapor deposition (CVD) process is performed to cover the top surface 104 of the N-type semiconductor substrate 102 with a capacitor dielectric layer 138, so that the capacitor dielectric layer 138 is in contact with the N-type heavily doped region 136, and the capacitor dielectric layer 138 disposed on the N-type heavily doped region 136 serves as a dielectric layer of the snubber capacitor. In the present embodiment, the capacitor dielectric layer 138 is disposed on the N-type heavily doped region 136 in the second device region 110, and extends onto the ILD layer 130 in the first device region 108. The present invention is not limited that the capacitor dielectric layer 138 cover the ILD layer 130 in the first device region 108, and the capacitor dielectric layer 138 can only be disposed on the N-type heavily doped region 136 in the second device region 110. It should be noted that a temperature of the CVD process is smaller than temperatures of the drive-in processes of respectively forming the N-type doped source region 128, the P-type doped base region and the N-type heavily doped region 136 in the present embodiment. Thus the characteristic of the power transistor device can be prevented from change which is resulted from the areas of the N-type doped source region 128, the first P-type doped base region 122a, the second P-type doped base region 122b and the N-type heavily doped region 136 continuously diffusing due to overlarge temperature. Therefore, the method of forming the capacitor dielectric layer 138 of the present invention is preferable to be the CVD process. The present invention is not limited herein, and the present invention also can use a dry oxidation process or a wet oxidation process to form a silicon nitride (Si3N4) or an oxide layer/silicon nitride/oxide layer (ONO). In addition, a thickness and a dielectric constant of the capacitor dielectric layer 138 are related to the capacitance of the snubber capacitor. In order to avoid increasing the thickness of the power semiconductor device due to the thickness of the capacitor dielectric layer 138 being over thick, the material of the capacitor dielectric layer 138 includes oxide or nitride, such as silicon oxide or silicon nitride, and has a preferably dielectric constant, and the dielectric constant of the capacitor dielectric layer 138 is larger than the dielectric constant of the ILD layer 130. The voltage endurance takes 30 volts as an example, and the thickness of the capacitor dielectric layer 138 is in a range from 200 angstroms to 3000 angstroms in the present embodiment. Moreover, the dielectric constant of the capacitor dielectric layer 138 is related to temperature and duration of the process of forming the capacitor dielectric layer 138, so that the material of the capacitor dielectric layer 138, the temperature and the duration of the process of forming the capacitor dielectric layer 138, the thickness of the capacitor dielectric layer 138 and the contact area between the capacitor dielectric layer 138 and the N-type heavily doped region 136 can be adjusted to manufacture the snubber capacitor with a required capacitance in the present invention. The required capacitance of the snubber capacitor can be adjusted according to the output capacitance of the required power semiconductor device.

Figure 10:
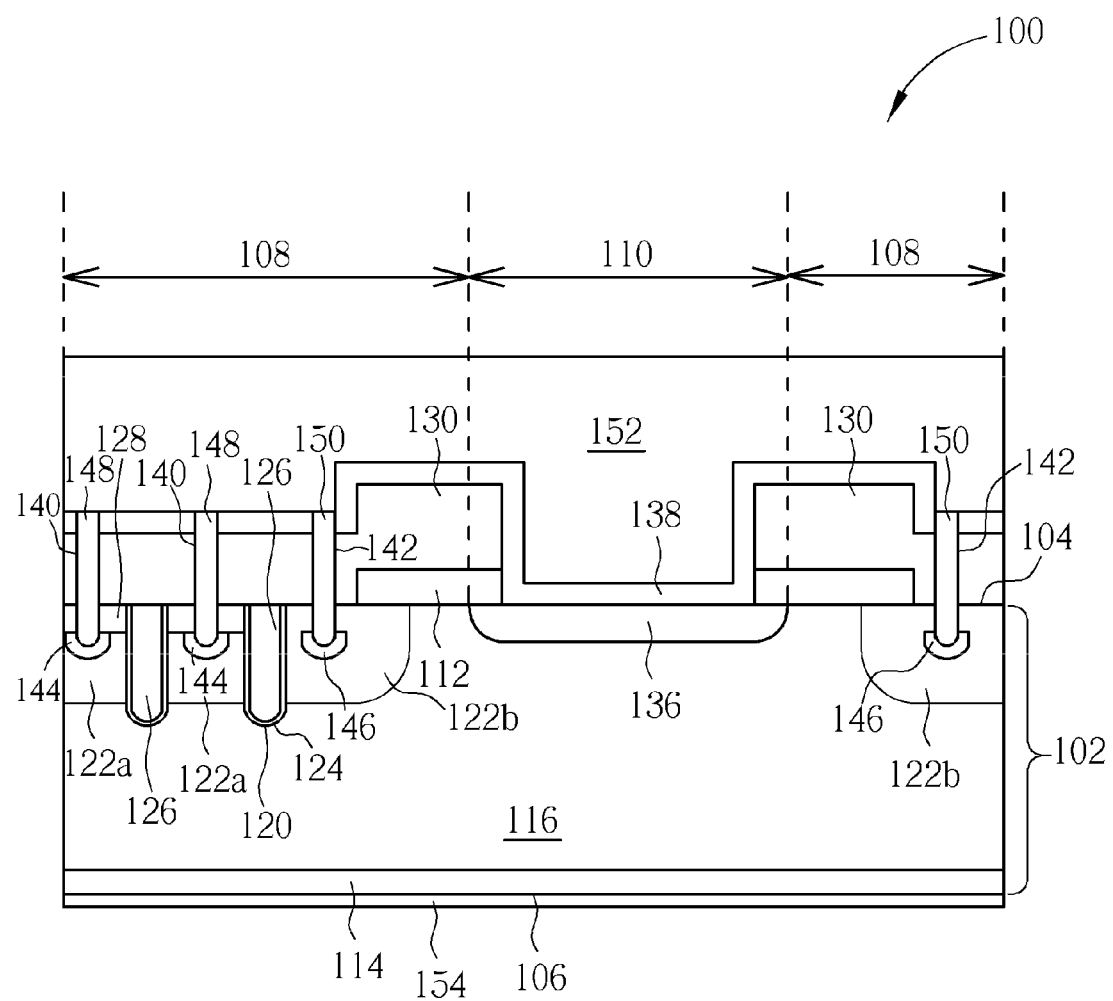

Next, as shown in FIG. 10, a photolithographic and etching process is performed to form at least one first contact hole 140 and at least one second contact hole 142 in the ILD layer 130 and the capacitor dielectric layer 138 of the first device region 108. The first contact hole 140 penetrates the N-type doped source region 128, and exposes the first P-type doped base region 122a. The second contact hole 142 exposes the second P-type doped base region 122b. Then, an ion implantation process and a drive-in process are performed to form a P-type doped source contact region 144 in each first P-type doped base region 122a and form a P-type doped contact region 146 in the second P-type doped base region 122b. The P-type doped source contact region 144 is disposed under the N-type doped source region 128. Then, the first contact hole 140 is filled with a first contact plug 148, and the second contact hole 142 is filled with a second contact plug 150. Finally, a source metal layer 152 and a gate metal layer (not shown in FIG. 10) are formed on the top surface 104 of the N-type semiconductor substrate 102, and the power semiconductor device 100 with the adjustable output capacitance in the present embodiment is completed. The material of the source metal layer 152, the gate metal layer and the drain metal layer 154 can be metal, such as TiW, TiN or W, and is not limited herein. It should be noted that the drain metal layer 154 is formed on the bottom surface 106 of the N-type semiconductor substrate 102, and the formation of the drain metal layer 154 is not limited to be formed in this step. The formation of the drain metal layer 154 may be performed in other steps; i.e. before or after the processes of forming the devices on the top surface 104 of the N-type semiconductor substrate 102.

As the above-mentioned description, the N-type doped source region 128 serves as a source of a MOSFET device; the N-type semiconductor substrate 102 serves as a drain of the MOSFET device; the gate conductive layer 126 serves as a gate of the MOSFET device; and the part of the first P-type doped base region 122a adjacent to the insulating layer 124 serves as a channel of the MOSFET device. The power transistor device in the first device region 108 is a MOSFET in the present embodiment. In addition, the second P-type doped base region 122b and the N-type semiconductor substrate form a parasitic diode device of a PN junction contact. The N-type heavily doped region 136 is electrically connected to the drain metal layer 154, and serves as an electrode of the snubber capacitor. The capacitor dielectric layer 138 is directly disposed on the N-type heavily doped region 136. The source metal layer 152 covers the capacitor dielectric layer 138 in the second device region 110, and serves as the other electrode of the snubber capacitor. Therefore, the source metal layer 152, the capacitor dielectric layer 138 and the N-type heavily doped region 136 form the snubber capacitor.

Figure 11:
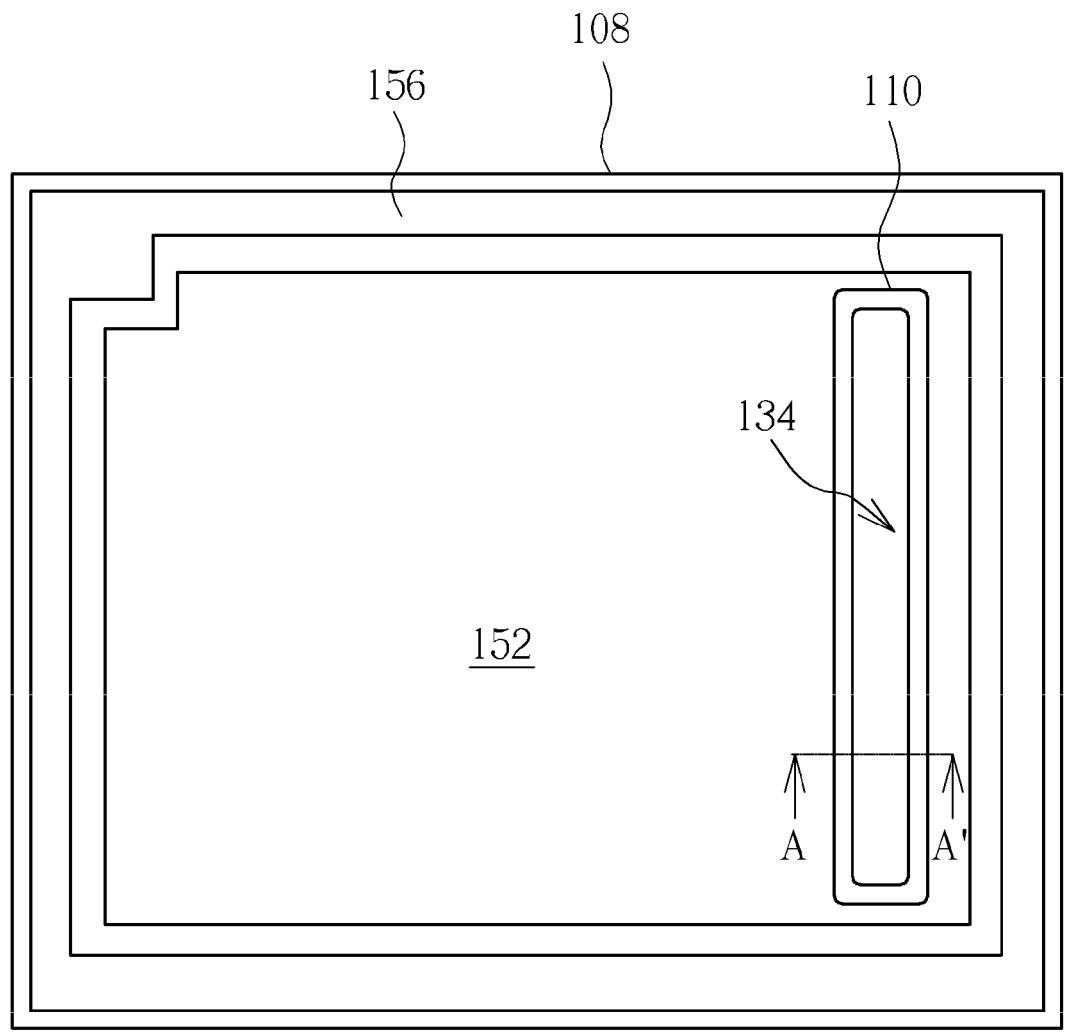
FIG. 11 is a schematic diagram illustrating a top view of the power semiconductor device according to the first embodiment of the present invention.
Figure 12:
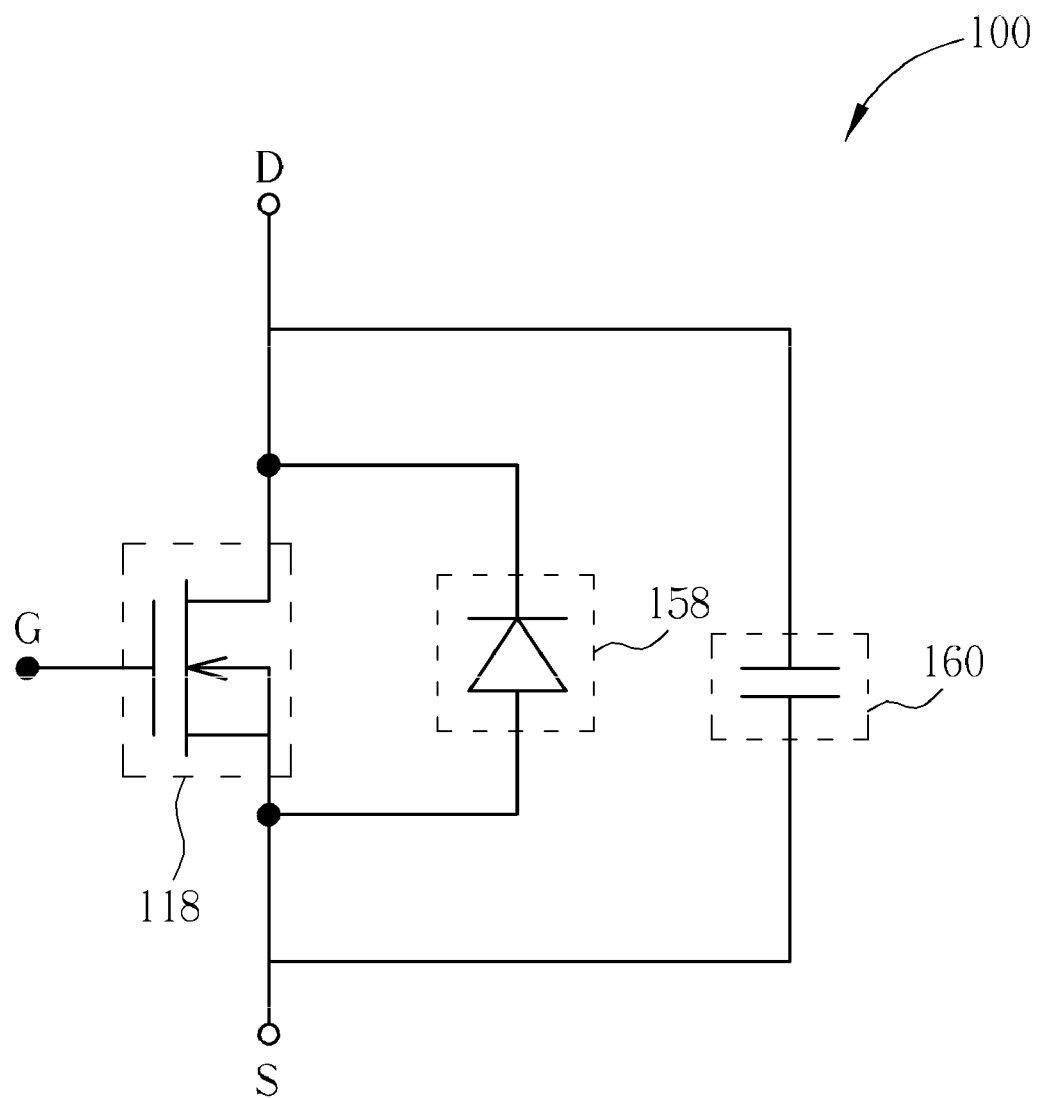
FIG. 12 is a schematic diagram illustrating a circuit of the power semiconductor device according to the first embodiment of the present invention.

In order to clearly describe the power semiconductor device and the circuit structure thereof, please refer to FIG. 11 and FIG. 12, and refer to FIG. 10 together. FIG. 11 is a schematic diagram illustrating a top view of the power semiconductor device according to the first embodiment of the present invention, and FIG. 12 is a schematic diagram illustrating a circuit of the power semiconductor device according to the first embodiment of the present invention. FIG. 10 is a schematic diagram illustrating a cross-sectional view of the power semiconductor device, taken along a line AA' of FIG. 11. As shown in FIG. 11, the gate metal layer 156 is disposed in the first device region 108, and surrounds the source metal layer 152 and the second device region 110. For avoiding the structure in the second device region 110 affecting the layout design in the first device region 108, the second device region 110 of the present embodiment is disposed at an edge of the source metal layer 152, and overlaps the source metal layer 152. The second device region 110 of the present embodiment is strip-shaped, and is not limited herein. Furthermore, the longer is the length of the second device region 110 along a side of the source metal layer 152, the larger is the capacitance of the snubber capacitor. Accordingly, the length of the second device region 110 along the side of the source metal layer 152 should be depended on the required capacitance of the snubber capacitor in the power semiconductor device 100.

As shown in FIG. 10 and FIG. 11, in the present embodiment, the power transistor device is a MOSFET device, and the source metal layer 152 is electrically connected to the N-type doped source region 128 as the drain of the power transistor device through the first contact plug 148 and electrically connected to the second P-type doped base region 122b as the P junction of the parasitic diode device through the second contact plug 150. Thus the drain of the power transistor device, the N junction of the parasitic diode device and an end of the snubber capacitor are electrically connected to each other. In addition, the drain metal layer 154 is electrically connected to the N-type epitaxial layer 116 as the drain of the power transistor device and as the N junction of the parasitic diode device through the N-type substrate 114, and the drain metal layer 154 is electrically connected to the N-type heavily doped region 136 as an electrode of the snubber capacitor through the N-epitaxial layer 116. Thus the drain of the power transistor device, the N junction of the parasitic diode device and the other end of the snubber capacitor are electrically connected to each other. The gate conductive layer 126 as the gate of the power transistor device is electrically connected to the gate metal layer 156. As shown in FIG. 12, the parasitic diode device 158 and the snubber capacitor 160 are electrically connected in parallel between the source and the drain of the power transistor device 118. Therefore, the output capacitor of the power semiconductor device 100 further includes the snubber capacitor 160 besides the output capacitor of the power transistor device 118, and the output capacitance of the power semiconductor device 100 in the present embodiment can be increased. Accordingly, when the power semiconductor device 100 is turned off, the voltage spikes can be reduced, and the power loss can be reduced.

Figure 13:
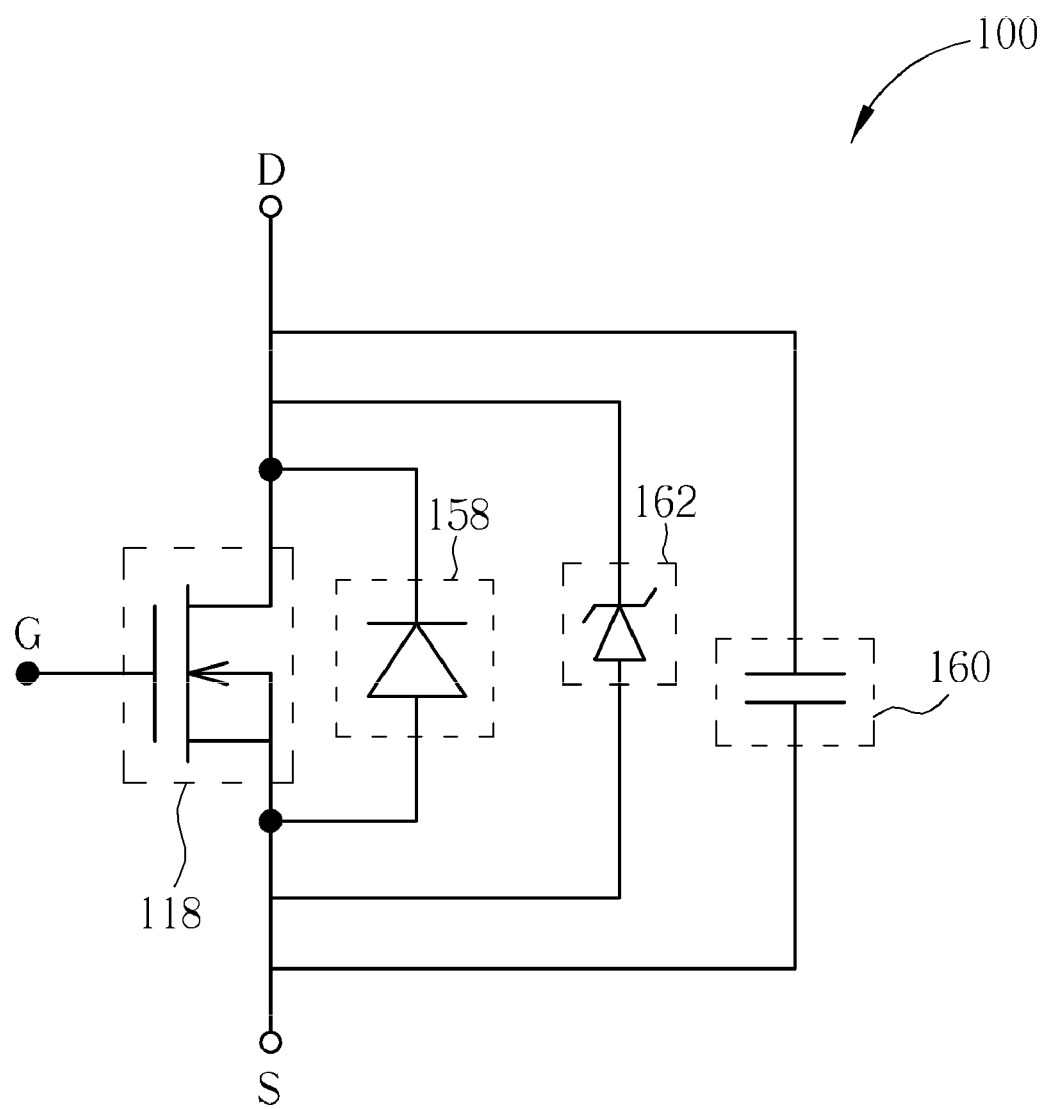
FIG. 13 is a schematic diagram illustrating a circuit of the power semiconductor device integrated with a schottky rectifier according to the first embodiment of the present invention.

Please refer to FIG. 13, which is a schematic diagram illustrating a circuit of the power semiconductor device integrated with a schottky rectifier according to the first embodiment of the present invention. As shown in FIG. 13, the power semiconductor device with the snubber capacitor of the present embodiment can further include a schottky rectifier 162, and a positive end and a negative end of the schottky rectifier 162 are electrically connected to the source and the drain of the power transistor device 118 respectively; i.e. the positive end and the negative end of the schottky rectifier 162 are electrically connected to the source metal layer 152 and the drain metal layer 154 respectively.

Figure 14:
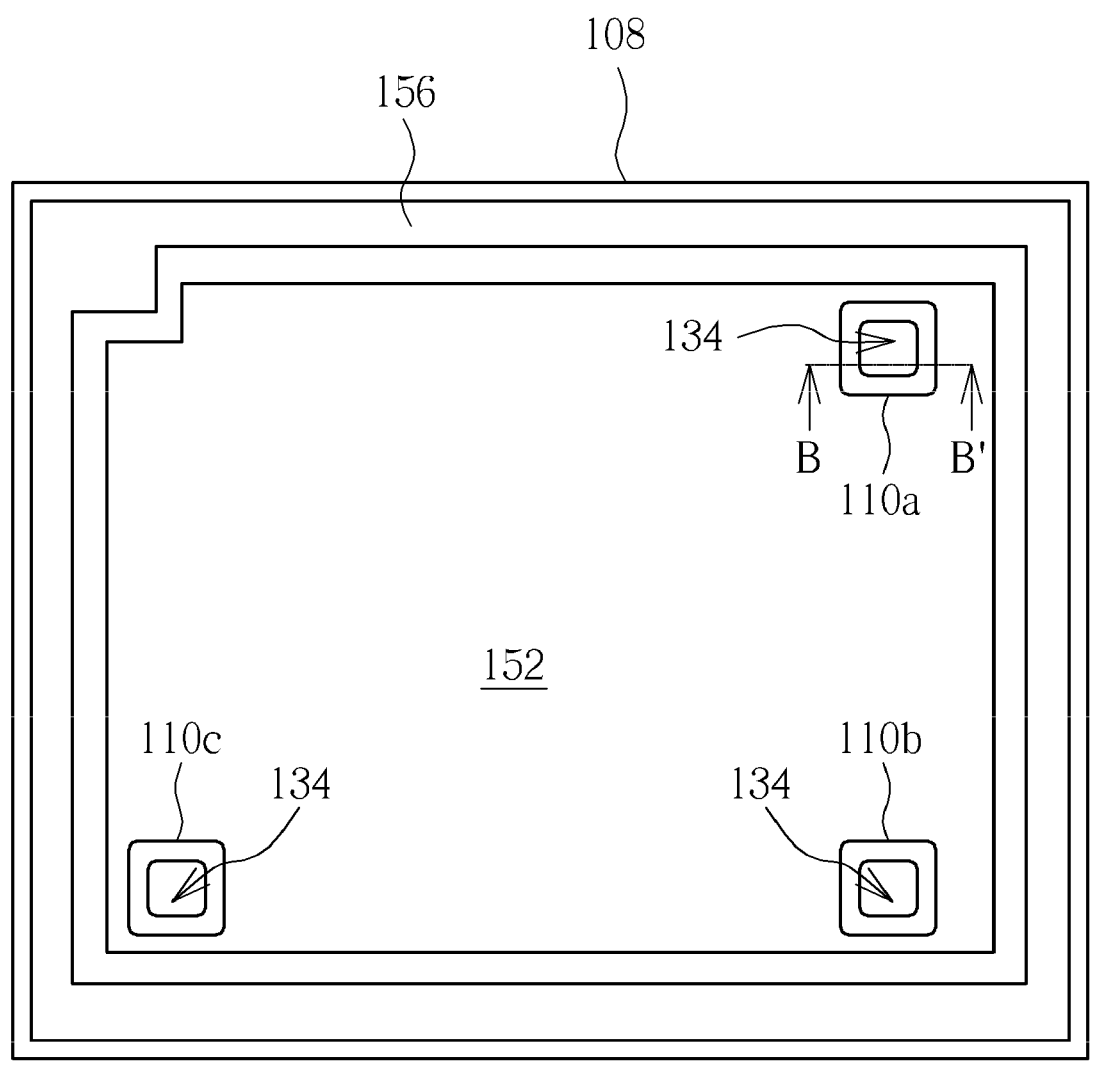
FIG. 14 is a schematic diagram illustrating a top view of another example of the power semiconductor device according to the first embodiment of the present invention.

The power semiconductor device of the present invention is not limited to have only one second device region and have only one snubber capacitor, and the power semiconductor device of the present invention also can have a plurality of second device regions for disposing a plurality of snubber capacitors. Please refer to FIG. 14, which is a schematic diagram illustrating a top view of another example of the power semiconductor device according to the first embodiment of the present invention. FIG. 10 is a schematic diagram illustrating a cross-sectional view, taken along a line BB' of FIG. 14. As shown in FIG. 14, the power semiconductor device 100 of the example has three second device regions 110a, 110b, 110c. Each second device region 110a, 110b, 110c is square, and is respectively disposed at three corners of the source metal layer 152 to prevent from occupying too many spaces of the power semiconductor device. The present invention is not limited herein.

Figure 15:
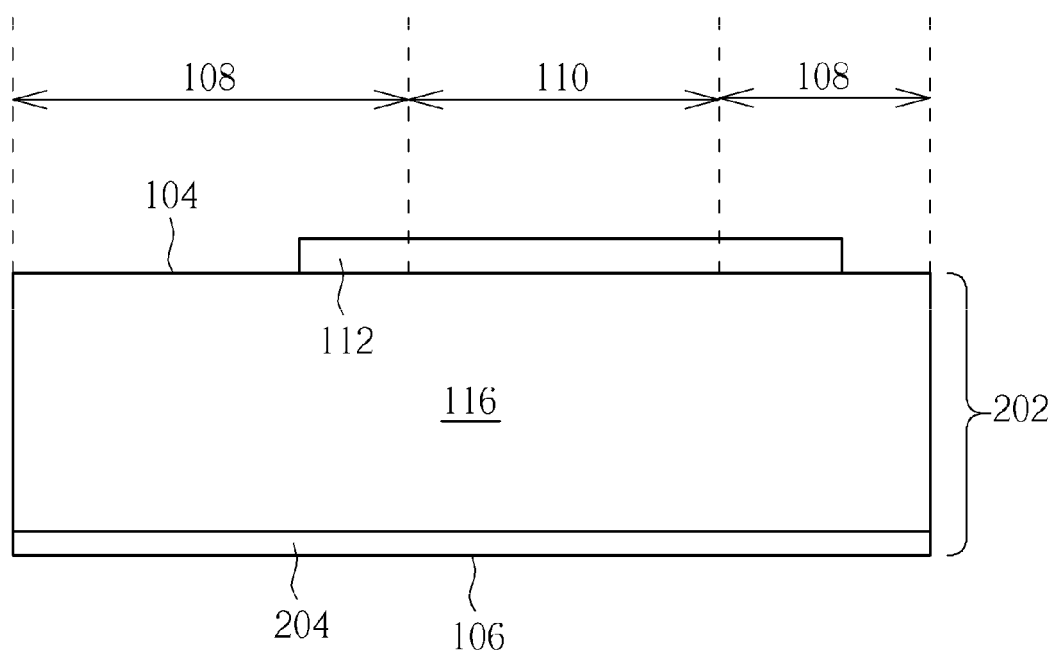
FIG. 15 and FIG. 16 are schematic diagrams illustrating a manufacturing method of a power semiconductor device according to a second embodiment of the present invention.
Figure 16:
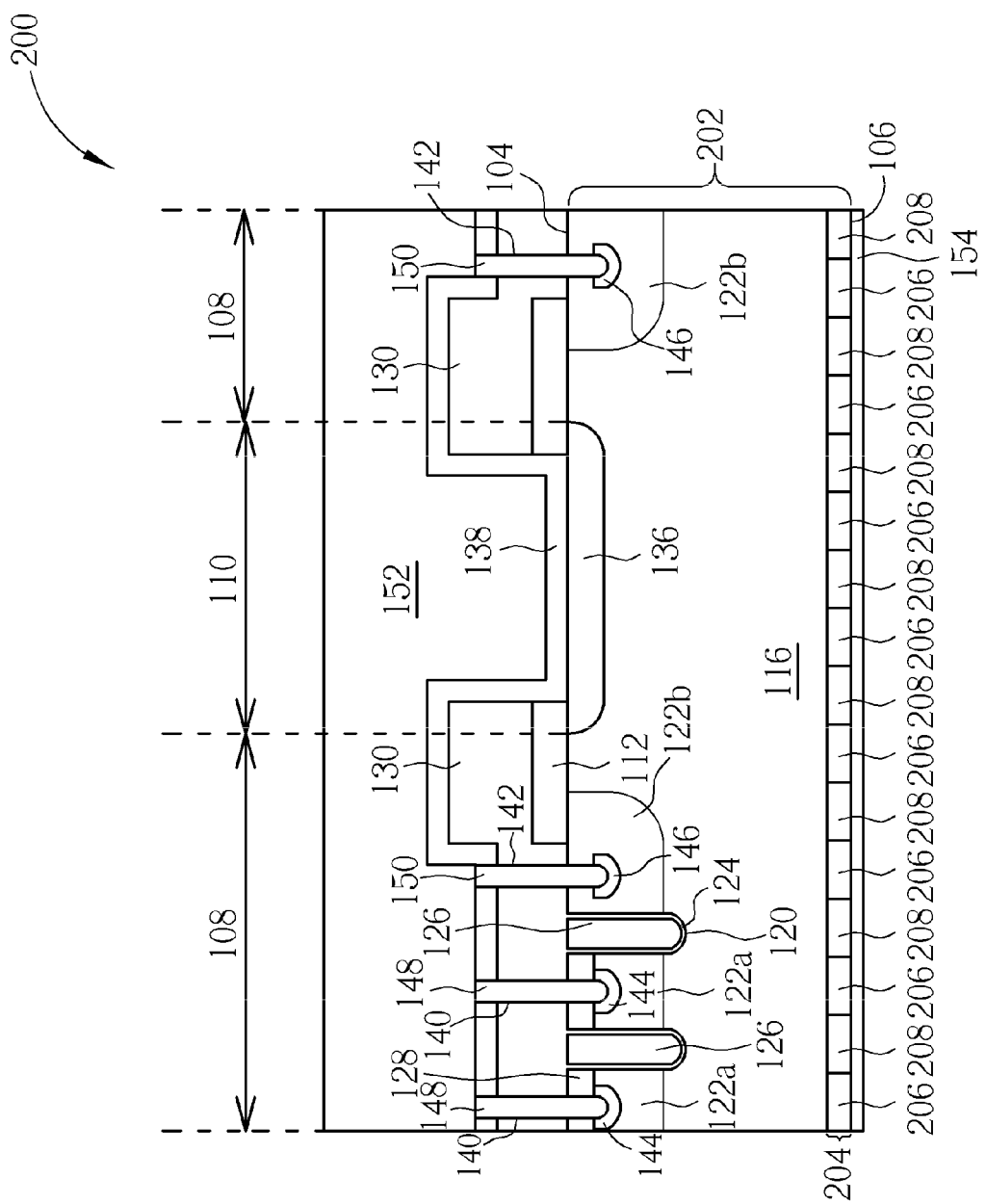

In addition, the power transistor device is not limited to be a MOSFET device, and can be other kinds of the power transistor devices, such as insulated gate bipolar transistor (IGBT). Please refer to FIG. 15 and FIG. 16, which are schematic diagrams illustrating a manufacturing method of a power semiconductor device according to a second embodiment of the present invention. FIG. 16 is a schematic diagram illustrating a cross-sectional view of the power semiconductor device according to the second embodiment of the present invention. Because parts of steps in the method of the second embodiment are the same as the first embodiment, please refer to FIG. 4 through FIG. 9 for the parts of the steps. Like number numerals designate similar or the same parts, regions or elements. As shown in FIG. 15 and FIG. 16, compared with first embodiment, the substrate 204 of the semiconductor substrate 202 in the present embodiment is formed by a plurality of first doped regions 206 and a plurality of second doped regions 208, and the first doped regions 206 and the second doped regions 208 are in contact with the drain metal layer 154. Each first doped region 206 and each second doped region 208 are sequentially disposed along a direction in parallel to the drain metal layer 154, and are disposed on the drain metal layer 154. The first doped regions 206 have the first conductive type, and the second doped regions 208 have the second conductive type. In the present embodiment, it should be noted that the P-type second doped regions 208 are doped in the substrate 204 in the power semiconductor device 200. Thus the power transistor device of the present embodiment is an IGBT device, and the N-type first doped region 206 remains in the substrate 204. The parasitic diode device formed by the second P-type doped base region 122b and the N-type epitaxial layer 116 still can operate.

In the present invention, the manufacturing method of the power semiconductor device simultaneously fabricates the snubber capacitor in the step of fabricating the power transistor device, so that the power transistor device and the snubber capacitor are manufactured within a same power semiconductor device. The snubber capacitor and the power transistor device in the power semiconductor device use a same drain metal layer and a same source metal layer, and the snubber capacitor is electrically connected between the drain and the source of the power transistor device. Accordingly, the output capacitance of the power semiconductor device can be raised, and the problem of the voltage spikes is solved when the power semiconductor device is turned off. Further, the power semiconductor device in the present invention does not require electrically connecting to any extra snubber circuit, and the cost of the power semiconductor device in the present invention can be reduced.

Those skilled in the art will readily observe that numerous modifications and alterations of the device and method may be made while retaining the teachings of the invention.

What is claimed is:

1. A power semiconductor device having an adjustable output capacitance, comprising:
   a semiconductor substrate, having a top surface and a bottom surface, and the top surface of the semiconductor substrate having a first device region and a second device region defined thereon, wherein the semiconductor substrate comprises a substrate and an epitaxial layer, and the epitaxial layer has a first conductive type and is disposed on the substrate;
   at least one power transistor device, disposed in the semiconductor substrate of the first device region;
   a heavily doped region, having the first conductive type and disposed in the semiconductor substrate of the second device region, and an implantation concentration of the heavily doped region being higher than an implantation concentration of the epitaxial layer;
   a capacitor dielectric layer, disposed on the heavily doped region, and the capacitor dielectric layer being in contact with the heavily doped region;
   a source metal layer, disposed on the top surface of the semiconductor substrate, and the source metal layer being electrically connected to the power transistor device, wherein the source metal layer, the capacitor dielectric layer and the heavily doped region disposed in the second device region form a snubber capacitor, and the source metal layer covers the heavily doped region; and
   a drain metal layer, disposed on the bottom surface of the semiconductor substrate.

2. The power semiconductor device of claim 1, wherein an implantation concentration of the heavily doped region is in a range from $10^{12}$ cm$^{-3}$ to $10^{16}$ cm$^{-3}$.

3. The power semiconductor device of claim 1, wherein a thickness of the capacitor dielectric layer is in a range from 200 angstroms to 3000 angstroms.

4. The power semiconductor device of claim 1, wherein the capacitor dielectric layer extends onto the semiconductor substrate in the first device region.

5. The power semiconductor device of claim 1, further comprising a field oxide layer, disposed on the semiconductor substrate at a border between the first device region and the second device region.

6. The power semiconductor device of claim 1, wherein the semiconductor substrate in the first device region has at least one trench, and the power transistor device comprises:
   an insulating layer, disposed on a sidewall of the trench;
   a gate conductive layer, disposed in the trench;
   a first doped base region, having a second conductive type, and the first doped base region being disposed in the semiconductor substrate at a side of the trench; and
   a doped source region, having the first conductive type, and the doped source region being disposed in the first doped base region and electrically connected to the source metal layer.

7. The power semiconductor device of claim 6, wherein the power transistor device further comprises:
   an inter-layer dielectric (ILD) layer, disposed between the semiconductor substrate and the source metal layer in the first device region;
   a doped source contact region, having the second conductive type, and the doped source contact region being disposed in the first doped base region under the doped source region; and
   a first contact plug, penetrating the ILD layer and the doped source region to electrically connect the drain metal layer to the doped source contact region and the doped source region.

8. The power semiconductor device of claim 7, wherein a dielectric constant of the capacitor dielectric layer is larger than a dielectric constant of the ILD layer.

9. The power semiconductor device of claim 6, wherein the power transistor device further comprises a second doped base region having the second conductive type and a second contact plug, the second doped base region is disposed in the semiconductor substrate at a side of the trench adjacent to the second device region, and the second contact plug electrically connects the source metal layer to the second doped base region.

10. The power semiconductor device of claim 1, wherein the substrate has the first conductive type, and the power transistor device is a metal-oxide-semiconductor field-effect transistor (MOSFET) device.

11. The power semiconductor device of claim 1, wherein the substrate has the second conductive type, and the power transistor device is an insulated gate bipolar transistor (IGBT) device.

12. The power semiconductor device of claim 1, further comprising a schottky rectifier, and a positive end and a negative end of the schottky rectifier being electrically connected to a source and a drain of the power transistor device respectively.

* * * * *